United States Patent [19]
Brown et al.

[11] 4,265,013
[45] May 5, 1981

[54] APPARATUS FOR DRIVING PINS INTO A PRINTED CIRCUIT BOARD AND THE LIKE

[75] Inventors: Vincent B. Brown, Prospect Heights; Charles A. Kozel, McHenry, both of Ill.

[73] Assignee: Methode Electronics, Inc., Chicago, Ill.

[21] Appl. No.: 37,741

[22] Filed: May 10, 1979

[51] Int. Cl.³ .............................................. H05K 3/32
[52] U.S. Cl. ...................................... 29/739; 29/845; 227/110; 227/116
[58] Field of Search ................. 29/739, 741, 845, 881, 29/882, 884; 227/110, 116

[56] References Cited
U.S. PATENT DOCUMENTS

| | | | |
|---|---|---|---|
| 3,765,075 | 10/1973 | Olney, Jr. et al. | 29/739 |
| 4,030,180 | 6/1977 | Pierson | 29/741 |

Primary Examiner—Carl E. Hall
Attorney, Agent, or Firm—Charles F. Pigott, Jr.; Garrettson Ellis

[57] ABSTRACT

An apparatus for driving pins into a printed circuit board and the like which comprises: table means for receiving and retaining a board into which the pins are to be driven; magazine means for holding a supply of the pins in a position parallel to the plane of the table, and receiver means, pivotally movable to receive the pin from the magazine means in one pivotal position and to pivot the pin into transverse relation with the table means in a second pivoting position. Loading means are provided for inserting the pins into the receiver means. Means are also provided for moving the receiver means while in the second pivoting position to drive the pin inserted in it into the board.

13 Claims, 6 Drawing Figures

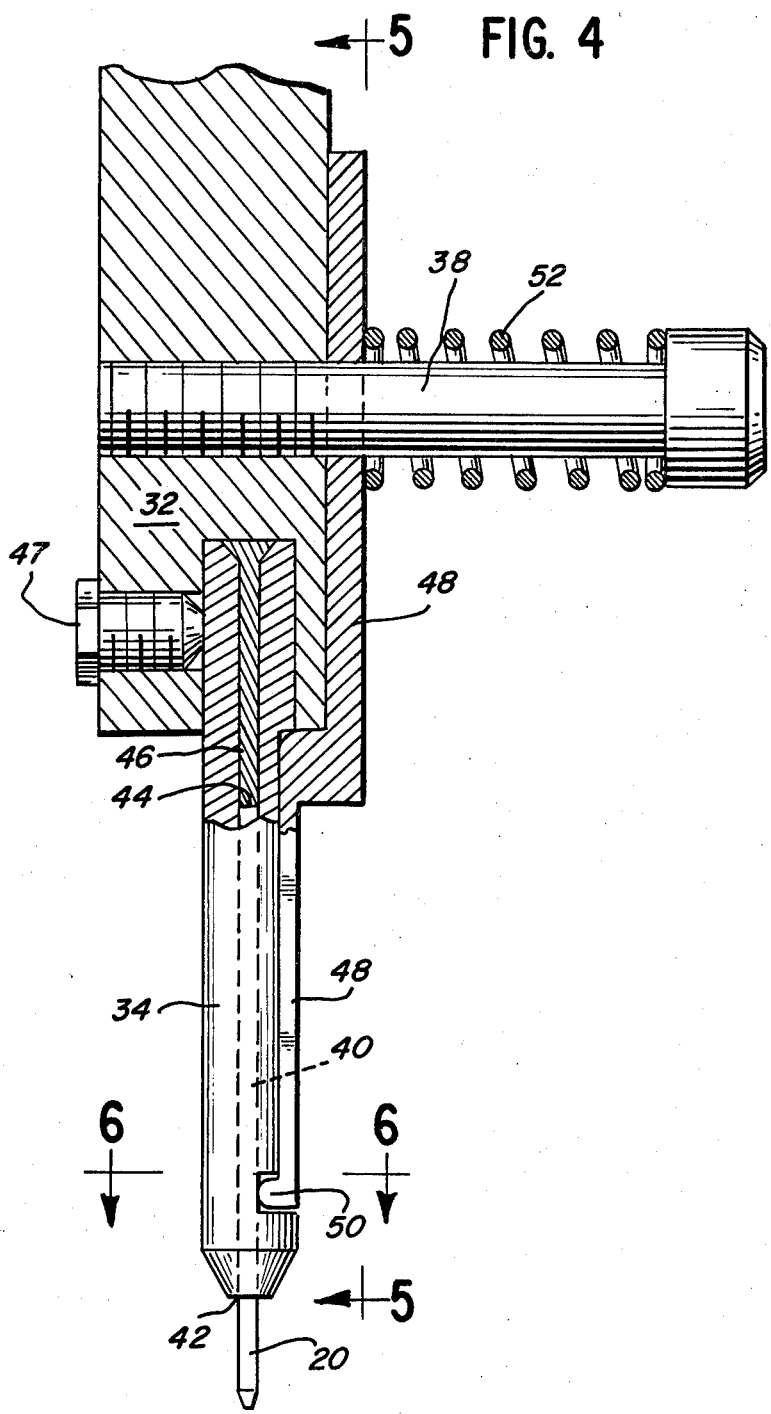
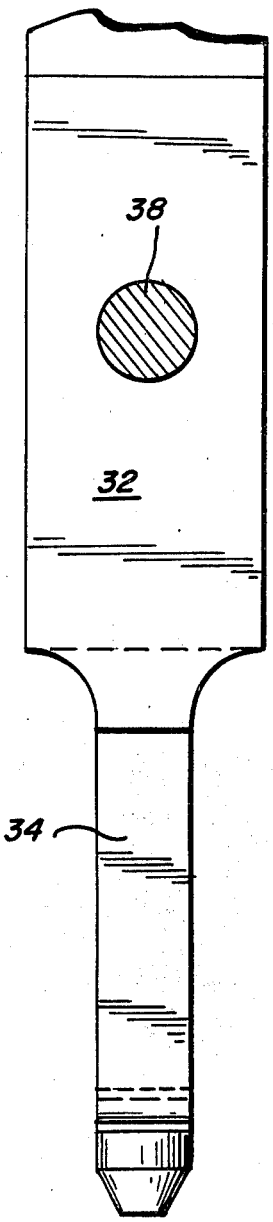
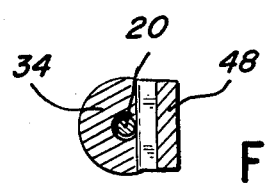
FIG. 4
FIG. 5
FIG. 6

APPARATUS FOR DRIVING PINS INTO A PRINTED CIRCUIT BOARD AND THE LIKE

BACKGROUND OF THE INVENTION

Apparatus for inserting pins into a printed circuit board or the like are known, for example, in Reggi U.S. Pat. No. 3,939,542, among others. The pins for a printed circuit board can serve as terminals for the various connections of the printed circuitry on the board. The pins must of course be very carefully positioned on the board, so that good electrical contact is made in all cases.

It is a desirable feature of pin driving equipment for a printed circuit board or the like to have the capability of driving a pin quickly into any selected location on the printed circuit board, between other components which have been previously assembled or otherwise applied to the board. This avoids the often less desirable step of driving the pins before other components are mounted on the board in the assembly process.

Also, it is desired to mount the printed circuit board on a horizontal table, particularly an X-Y table which an automatically move to various horizontal positions along both an X and Y axis, for precise and automatic positioning in of the printed circuit board under the pin-driving apparatus.

It is desirable to use a pin magazine in which each pin can be removed from the magazine in a horizontal position, and then moved to a vertical position in transverse relation to the table and the printed circuit board for driving.

The above desired features are accomplished in this present invention, to provide improved flexibility of operation and facilitated manufacturing techniques for the assembly of printed circuit board or other precision devices into which pins are mounted.

DESCRIPTION OF THE INVENTION

In accordance with this invention, an apparatus is provided for driving pins into a printed circuit board and the like. The apparatus comprises table means for receiving and retaining a board into which the pins are to be driven. Magazine means are also provided for holding a supply of the pins in a position parallel to the plane of the table means. Receiver means are also provided, the receiver means being pivotally movable to receive a pin from the magazine means in a first pivotal position, and to pivot the pin into transverse relation with the table means in a second pivotal position.

Loading means are provided for inserting the pins, typically one per cycle, into the receiver means. Means are also provided for moving the receiver means while in the second position to drive the pin into the board.

Thereafter, the receiver means may be withdrawn again, leaving the pin in the board, and pivoted back into the first pivotal position for receiving another pin.

Typically, the pivotally mounted receiver means may be spring-biased into its first pivoting position, with the receiver means being movable in slide means along a path which is generally perpendicular to the table, for advancement and retraction of the receiver toward and away from the table and board. Cam means may be provided for automatically pivoting the receiver into the second pivoting position as it is advanced in the slide means toward the table and board, for driving of the pin into the board.

The receiver may be a tubular member defining a bore with an open outer end and a closed inner end, adapted to receive the pin. Means may be provided for frictionally retaining the pin in the receiver until it is driven into the board.

The means for moving the receiver means while in the second pivoting position may be a pressurized piston and cylinder utilized to advance and retract the receiver along the slide.

Generally, means are provided for supporting the board at the point where the pin is driven into the board so that the board is not unduly flexed or otherwise stressed, which can damage printed electronic components already present on the board. Referring to the drawings, FIG. 1 is a perspective view of the apparatus for driving pins in accordance with this invention.

FIG. 4 is a further enlarged elevational view, taken partly in vertical section, of a portion of the apparatus of FIG. 3 but rotated 90° therefrom about the vertical axis.

FIG. 5 is a fragmentary, elevational view taken along lines 5—5 of FIG. 4.

FIG. 6 is a transverse sectional view taken along lines 6—6 of FIG. 4.

Figure 1:
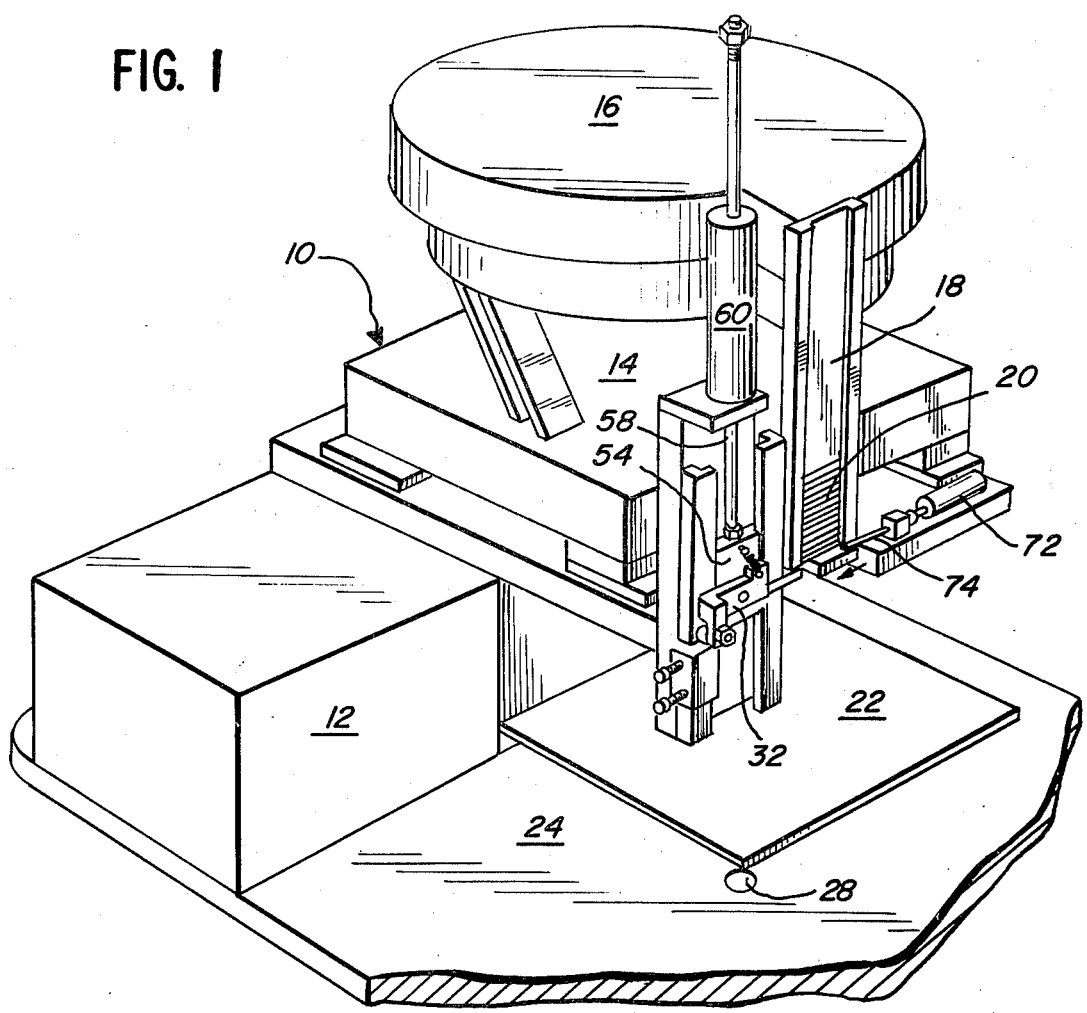

Referring to the drawings, pin driving apparatus 10 is shown in FIG. 1, comprising a control enclosure 12 for containing conventional controls for apparatus 10, the X-Y table, and the like. A frame 14 is provided and a bowl-type feeder 16 of conventional design for the loading of pins into magazine 18. Magazine 18 is shown to carry a plurality of pins 20 in horizontal position, prior to being driven into a circuit board 22 or the like.

Circuit board 22 rests on table means 24, which may comprise a conventional X-Y table for precise horizontal movement and positioning of circuit board 22. An insertion back-up means 26 (FIG. 3), which is conventionally adapted to reciprocate upwardly and downwardly, is positioned directly underneath the pin drive means, and is adapted to reciprocate on the pin driving step upwardly to support circuit board 22 as a pin 20 is driven into board 22.

Aperture 28 in table 24 may be provided in a predetermined manner at the site of each driven pin to permit back-up member 26 to directly support the underside of board 22. Back-up member 26 may have concave upper face 30 for receiving the end of pin 20.

Alternatively, concave apertures may be placed in table 24, each for receiving a pin 28 in a simplified technique. The use of the back-up member or concave portion protects the circuit board 22 from damage, and particularly prevents the copper circuit lines on the underside of board 22 from being delaminated from the surface of the board by the driving of pin 20.

Figure 2:
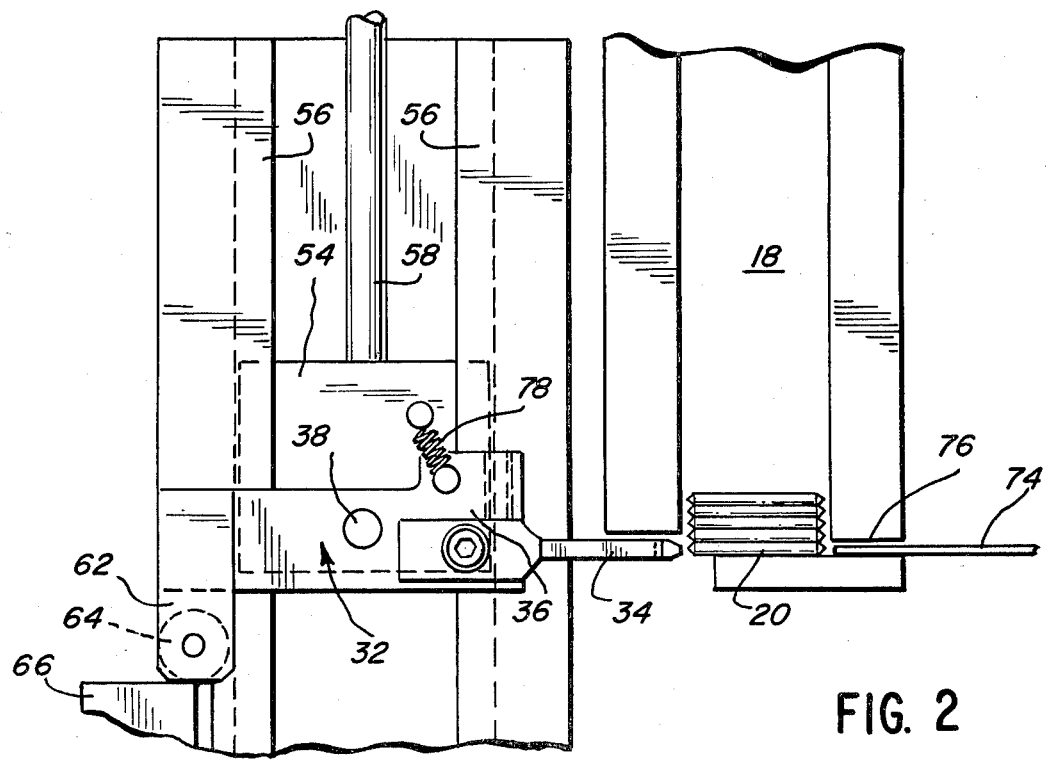
FIG. 2 is a fragmentary, enlarged, elevational view of a portion of the apparatus of this invention in which the receiver means is in its first pivotal position for receiving a pin from the magazine means.
Figure 3:
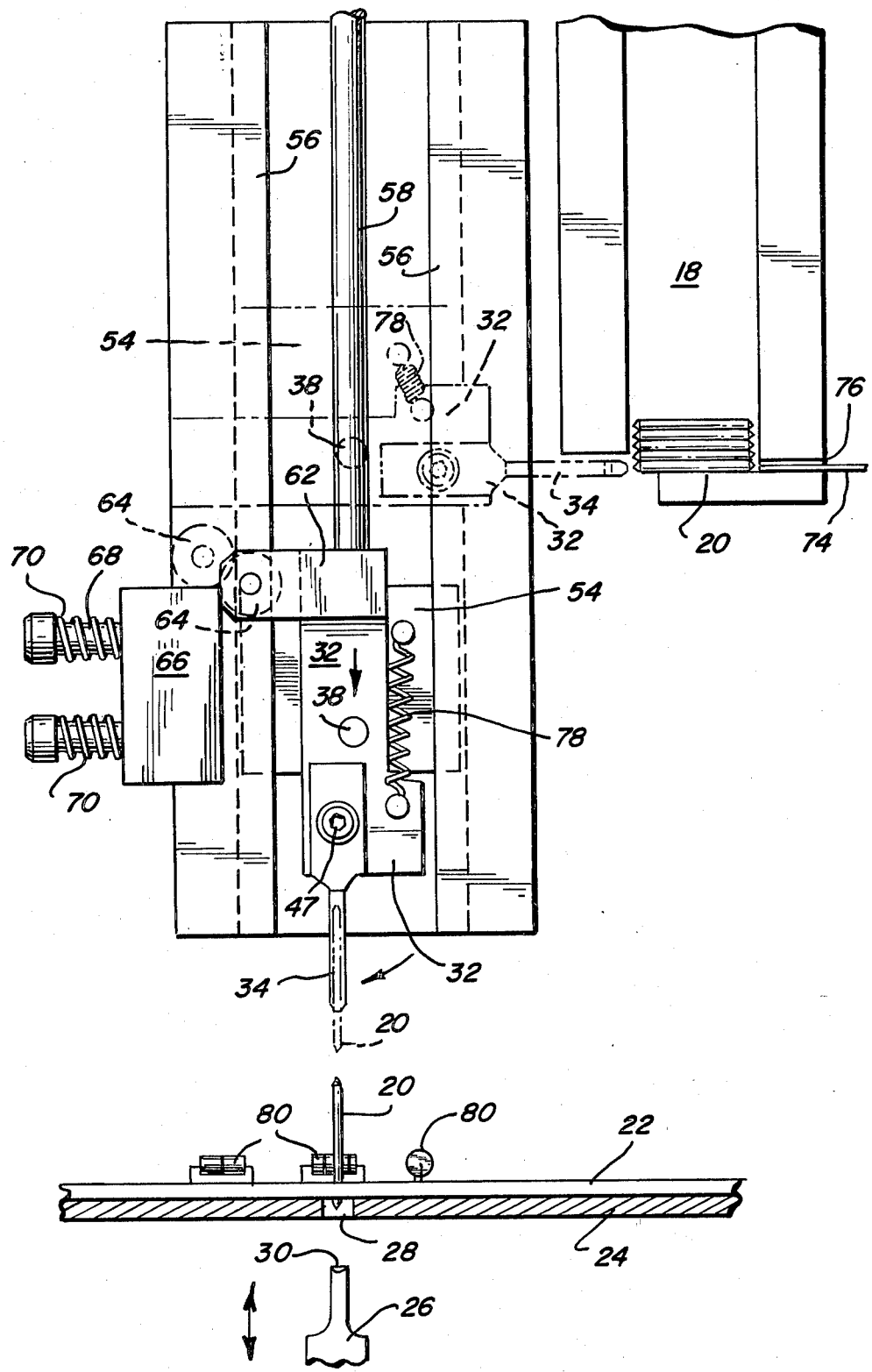
FIG. 3 is a fragmentary, elevational view showing the position of the apparatus of FIG. 1 in its second pivoting position in which the pin is in transverse relation with the table means.

In accordance with this invention, receiver means 32 are provided for receiving a pin 20 from the bottom of magazine 18 where a plurality of pins 20 may reside in a slot. Receiver 32 comprises a tubular member 34 and a carrier 36 for the tubular member, said carrier being pivotally mounted at 38 to receive a pin 20 from the magazine into tubular member 34 in the first pivotal position of receiver 32 as shown in FIG. 2, and to pivot the pin 20 into transverse relation with the table means 24 in a second pivoting position as shown in FIG. 3. Tubular member 34 defines a bore 40, shown in FIG. 4 to be carrying a pin 20, with an open outer end 42 and an inner end 44 which is closed by insert member 46. Bore 40 is adapted to receiver pin 20 as shown, for carrying it from the magazine and driving it into board 22. Retention bolt 47 removably holds tubular member 34 in receiver 32.

Frictional means for retaining the pin 20 in the tubular member 34 is provided by spring member 48, defining a tip member 50, which projects through an aperture in tubular member 34 to frictionally engage a pin 20, when present in bore 40.

Pivot bolt 38 is shown in FIG. 4 to be biased by spring member 52 to press the frictional spring member 48 firmly against receiver 32.

Pivoting receiver 32 is mounted on a reciprocating plunger member 54, which in turn slides upwardly and downwardly along tracks 56, impelled by operating rod 58 of pneumatic cylinder 60. FIGS. 1 and 2 show the pneumatic cylinder 60 and plunger 54 at the upward extent of their travel, while FIG. 3 shows operating rod 58 extended downwardly by the action of cylinder 60, to force receiver 32 and slide 54 downwardly along tracks 56.

Receiver 32 also carries a bracket member 62, which pivotally carries one or more roller members 64, positioned to enter into engagement with spring-loaded cam member 66, as particularly shown in FIG. 3. Cam member 66 is slidable upon posts 68, being biased into its inward position as shown in FIG. 3 by coil springs 70. Accordingly, in the event of a jam-up of the machine, cam 66 can be forced out of the way as pneumatic cylinder 60 forces members 32, 54 and 58 downwardly, but normally cam 66 remains fixed in its position as shown.

In the operation of the apparatus of this invention, pneumatic loading cylinder 72 (FIG. 1) forces plunger rod 74 to pass through aperture 76 of magazine 18, forcing the bottom pin 20 to enter the tubular member 34 of receiver 32, as shown in full lines in FIG. 2 and in phantom in FIG. 3. After pin 20 has been emplaced in receiver 32 and plunger 74 has withdrawn, pins 20 drop in magazine 18 to expose another pin for loading in the next step of the cycle, and pneumatic cylinder 60 advances rod 58 downwardly, causing members 32 and 54 to move downwardly.

In the beginning of the downward motion, as shown in FIG. 3, roller 64 engages cam 66, causing receiver 32 to pivot in clockwise manner about pivot 38, connected between receiver 32 and plunger member 54, so that tubular member 34 rotates from the horizontal to the vertical position, carrying pin 20 with it. In this operation, spring 78 which is attached to both receiver 32 and plunger member 54 is extended, placing a counter-clockwise rotational bias force on receiver 32. However, cam member 66 prevents counter-clockwise rotation while roller 64 is in engagement with it.

Following this, preferably as a single motion along with the previously described rotational motion, pneumatic cylinder 60 forcefully advances receiver 32 toward circuit board to drive pin 20 through the circuit board as shown in FIG. 3. Tubular member 34 is preferably of sufficient length, for example, at least one half inch, to selectively emplace a pin 20 between closely positioned resistor circuits 80 and the like on the circuit board without causing the receiver means to touch the closely positioned elements 80. Accordingly, the installation of the pins may, if desired, be one of the last manufacturing steps of the circuit board assembly, being capable of driving pins through the board closely adjacent to other elements on board 22.

In the situation of FIG. 3, the pin has been driven through board 22, and, impelled by pneumatic cylinder 60, rod 58 and receiver 32 have started to retract upwardly again. Because of the natural high frictional retention of a pin which is driven into a board, pin 20 slips past the frictional retention means 48, 50 of tubular member 34, to be retained in the board while the receiver withdraws upwardly, guided by plunger member 54 sliding in tracks 56. When roller 64 clears the upper limit of cam 66, spring 78 causes receiver 32 to rotate in counter-clockwise manner back into its first, horizontal position for receiving another pin 20 for driving.

Accordingly, with proper utilization of an X-Y table for positioning circuit board 22, the pins are rapidly and sequentially driven according to a predetermined program into board 22 at predetermined locations, being loaded one-by-one from magazine 18 into tubular member 34, and then being rotated as described above and forcefully driven by the pneumatic cylinder into the board 22.

The size of the tubular member 34 may be dictated by the size of the pins to be driven into board 22. Typically, in electronic circuit board technology the longest pin currently measures 1¼ inches. Tubular member 34 may have a reduced diameter for a distance which is greater than that dimension so it clears an adjacent pin or pins 20 on 0.1 or 0.156 inch centers, for example. Furthermore, it is preferred for the receiver 32 to be vertically movable for a distance of at least 1¾ inch while being held in the second vertical position by cam 66, to allow clearance of the pins above the printed circuit board so that they clear all previously mounted components.

In accordance with this invention, pins 20 which have flat surfaces may be used, being installable in the board so that the flat surfaces are all parallel. This allows the use of mating, interconnecting devices employing flat spring contact members. Cylindrical pins can also be processed in accordance with this invention.

The above has been offered for illustrative purposes only, and is not intended to limit the invention of this application, which is as defined in the claims below.

That which is claimed is:

1. An apparatus for driving pins into a printed circuit board and the like, which comprises: table means for receiving and retaining a board into which the pins are to be driven; magazine means for holding a supply of said pins in a position parallel to the plane of said table, and receiver means, said receiver means being pivotably movable to receive a pin from said magazine means in a first pivotal position, and to pivot said pin into transverse relation with said table means in a second pivotal position; said receiver means being movable in slide means along a path transverse to said table for advancement and retraction of the receiver means toward and away from the table and board, and cam means for automatically pivoting said receiver into said second pivotal position as it is advanced in said slide means toward the table and board; loading means for inserting pins into said receiver means; and means for moving said receiver means while in the second pivotal position to directly drive the pin into the board by advancement of said receiver means toward the board.

2. The apparatus of claim 1 in which said receiver comprises a tubular member defining a bore with an open outer end and a closed inner end, said bore being proportioned to receive said pin, and means for frictionally retaining said pin in the receiver until it is driven into the board.

3. The apparatus of claim 2 in which pressurized piston and cylinder means are utilized to advance and retract said receiver means along the slide means.

4. The apparatus of claim 3 in which said first pivoting position is horizontal, and said second pivoting position is vertical.

5. The apparatus of claim 4 in which means for supporting said board are present at the point where the pin is driven into the board.

6. The apparatus of claim 5 in which said tubular member of the receiver means is of sufficient length to selectively emplace a pin between closely positioned resistor elements and the like on the circuit board without causing said receiver means to touch said closely positioned elements.

7. The apparatus of claim 1 in which said loading means comprises a piston and cylinder positioned to force a pin from the bottom of said magazine means into the bore of the tubular member.

8. The apparatus of claim 1 in which said pivotally mounted receiver means is spring-biased into said first pivoting position.

9. The apparatus of claim 1 in which said receiver means comprises a tubular member defining a bore with an open outer end and a closed inner end adapted to receiver pins from said loading means, and means for frictionally retaining said pin in the receiver means until it is driven in the board, said frictional retaining means comprising an aperture in said receiver means communicating with said bore, and a spring member projecting through said aperture to resiliently press against a pin in the bore.

10. The apparatus of claim 1 in which said cam means is positioned in resiliently movable relation, being biased to an inward position at which said cam means is engagable with the receiver for said automatic pivoting, but in the event of a jam-up of the apparatus, said cam means can be forced out of the way as said receiver is driven downwardly.

11. The apparatus of claim 1 in which said receiver means carries roller means for engaging the cam in the first pivotal position and for rolling across the surface of the cam, to facilitate movement of said receiver means into the second pivotal position.

12. An apparatus for driving pins into a printed circuit board and the like which comprises table means for receiving and retaining a board into which the pins are to be driven; magazine means for holding a supply of said pins in a position parallel to the plane of said table, and receiver means, said receiver means being pivotally movable to receive a pin from said magazines in a first pivotal position, and to pivot said pin into transverse relation with said table means in a second pivotal position; said pivotally mounted receiver means being spring biased into said first pivoting position, the receiver means being movable in slide means along a path transverse to said table for advancement and retraction of the receiver toward and away from the table and board, and cam means for automatically pivoting said receiver into the second pivoting position as it is advanced in said slide means toward the table and board; loading means for inserting pins into said receiver means in said first pivotable position; and means for moving said receiver means while in the second pivotal position to directly drive the pin into the board by motion of said receiver means, said cam means being positioned in resiliently slidable relation to its normal position of engagement with the receiver means whereby, in the event of a jam-up of the apparatus, said cam means may be forced out of the way as said receiver means is driven toward the table means.

13. The apparatus of claim 12 in which said receiver means defines roller means positioned for engagement with said cam means in the first pivoting position, to roll across said cam means to facilitate said pivoting into the second pivotal position.

* * * * *